US009502515B2

(12) United States Patent
Tseng et al.

(10) Patent No.: US 9,502,515 B2
(45) Date of Patent: *Nov. 22, 2016

(54) SPLIT GATE FLASH MEMORY STRUCTURE WITH A DAMAGE FREE SELECT GATE AND A METHOD OF MAKING THE SPLIT GATE FLASH MEMORY STRUCTURE

(71) Applicant: Taiwan Semiconductor Manufacturing Co., Ltd., Hsin-Chu (TW)

(72) Inventors: Yuan-Tai Tseng, Zhubei (TW); Ming Chyi Liu, Hsinchu (TW); Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/980,165

(22) Filed: Dec. 28, 2015

(65) Prior Publication Data

US 2016/0111510 A1 Apr. 21, 2016

Related U.S. Application Data

(63) Continuation of application No. 14/316,864, filed on Jun. 27, 2014, now Pat. No. 9,269,829.

(51) Int. Cl.
| H01L 21/8238 | (2006.01) |
| H01L 29/792 | (2006.01) |
| H01L 29/423 | (2006.01) |
| H01L 29/66 | (2006.01) |
| H01L 27/115 | (2006.01) |

(52) U.S. Cl.
CPC ..... *H01L 29/42344* (2013.01); *H01L 27/1157* (2013.01); *H01L 29/66484* (2013.01); *H01L 29/66833* (2013.01); *H01L 29/792* (2013.01)

(58) Field of Classification Search
CPC .................. H01L 29/4234; H01L 27/11563
USPC ......... 257/324, 314, 298; 438/216, 261, 591
See application file for complete search history.

(56) References Cited

U.S. PATENT DOCUMENTS

| 9,269,829 B2 * | 2/2016 | Tseng .................... H01L 29/792 438/216 |
| 2010/0099246 A1 | 4/2010 | Herrick et al. |
| 2014/0167140 A1 | 6/2014 | Fang et al. |

OTHER PUBLICATIONS

Notice of Allowance dated Oct. 14, 2015 for U.S. Appl. No. 14/316,864.

* cited by examiner

*Primary Examiner* — Calvin Lee
(74) *Attorney, Agent, or Firm* — Eschweiler & Associates, LLC

(57) ABSTRACT

A method of manufacturing a split gate flash memory cell is provided. A select gate is formed on a semiconductor substrate. A sacrificial spacer is formed laterally adjacent to the select gate and on a first side of the select gate. A charge trapping layer is formed lining upper surfaces of the select gate and the sacrificial spacer, and further lining a sidewall surface of the select gate on a second side of the select gate that is opposite the first side of the select gate. A memory gate is formed over the charge trapping layer and on the second side of the select gate. The sacrificial spacer is removed. The resulting semiconductor structure is also provided.

20 Claims, 12 Drawing Sheets

SPLIT GATE FLASH MEMORY STRUCTURE WITH A DAMAGE FREE SELECT GATE AND A METHOD OF MAKING THE SPLIT GATE FLASH MEMORY STRUCTURE

REFERENCE TO RELATED APPLICATION

This Application is a continuation of U.S. application Ser. No. 14/316,864, filed on Jun. 27, 2014, now U.S. Pat. No. 9,269,829 issued Feb. 23, 2016, the contents of which are incorporated by reference in their entirety.

BACKGROUND

Flash memory is an electronic non-volatile computer storage medium that can be electrically erased and reprogrammed. It is used in a wide variety of commercial and military electronic devices and equipment. To store information, flash memory includes an addressable array of memory cells, typically made from floating gate transistors. Common types of flash memory cells include stacked gate memory cells and split gate memory cells. Split gate memory cells have several advantages over stacked gate memory cells, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
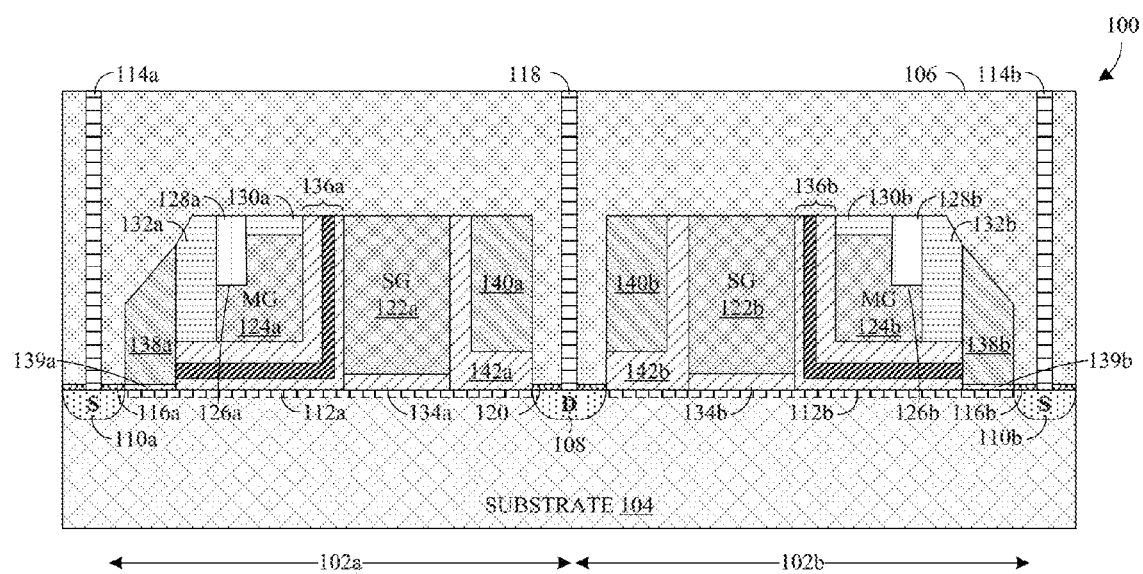
FIG. 1 illustrates a cross-sectional view of some embodiments of a semiconductor structure for a pair of split gate flash memory cells, the semiconductor structure free of select gate sidewall damage.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Common types of split gate flash memory cells include the so called silicon-oxide-nitride-oxide-silicon (SONOS) split gate flash memory cell and the so called metal-oxide-nitride-oxide-silicon (MONOS) split gate flash memory cell. The semiconductor structure of a SONOS or MONOS split gate flash memory cell includes a memory gate and a select gate spaced over a top surface of a semiconductor substrate between a source region and a drain region embedded in the top surface of the semiconductor substrate. For a SONOS split gate flash memory cell, the memory gate is formed from a silicon based material, such as polysilicon, and for a MONOS split gate flash memory cell, the memory gate is formed from a metal or metal alloy. Arranged between the select gate and the semiconductor substrate, the semiconductor structure includes a gate dielectric. Further, arranged between neighboring sidewalls of the memory gate and the select gate, and extending under the memory gate between the semiconductor substrate and the memory gate, the semiconductor structure includes a charge trapping dielectric. The charge trapping dielectric stores a variable amount of charge corresponding to a stored data value. Through selective biasing of the memory gate and the select gate, the amount of stored charge and the data value can be varied.

Typically, SONOS or MONOS split gate flash memory cells are formed in pairs with a shared source/drain region. According to some methods to forming the semiconductor structure for a pair of SONOS or MONOS split gate flash memory cells, a pair of select gates is formed spaced over a semiconductor substrate. A charge trapping dielectric layer is then conformally formed over the select gates and the semiconductor substrate. Further, a pair of memory gates corresponding to the pair of select gates is formed over and laterally abutting the charge trapping dielectric layer outside a central region between the select gates. To form the memory gates, a conductive layer is formed and an etch of the conductive layer is performed. Subsequent to forming the memory gates, portions of the remaining conductive layer within the central region are removed and then exposed portions of the charge trapping dielectric layer are removed.

A challenge posed by the foregoing methods to forming the semiconductor structure for a pair of SONOS or MONOS split gate flash memory cells is that removing those portions of the conductive layer within the central region reduces the thickness of portions of the charge trapping dielectric layer within the central region. As a result of this reduced thickness, the subsequent removal of exposed portions of the charge trapping dielectric layer damages the select gates and/or the gate dielectrics. Namely, because of the reduced thickness, exposed portions of the charge trapping dielectric layer within the central region are removed more quickly than exposed portions of the charge trapping dielectric layer outside the central region. During the period between when the exposed portions of the charge trapping dielectric layer within the central region are removed and the exposed portions of the charge trapping dielectric layer outside the central region are removed, the removal partially removes portions of the select gates and/or the gate dielectrics within the central region. The damage to the select gates and/or the gate dielectrics is exacerbated when applied to 28 nanometer (nm) micro fabrications.

In view of the foregoing, the present disclosure is directed to an improved method of forming the semiconductor structure for a pair of SONOS or MONOS split gate flash memory cells. As described in detail hereafter, the improved method forms the charge trapping dielectric layer so it does not line the central region between the select gates. As a result, the subsequent removal of exposed portions of the charge trapping dielectric layer does not damage the select gates and/or the gate dielectrics within the central region. Advantageously, the method is suitable for 28 nm micro fabrication, allows a larger process window, and yields damage free select gates and/or gate dielectrics. The present disclosure is further directed to the semiconductor structure for a pair of SONOS or MONOS split gate flash memory cells generated according to the method and having damage free select gates.

With reference to FIG. 1, a cross-sectional view 100 of an improved semiconductor structure for a pair of split gate flash memory cells 102a, 102b includes a first split gate flash memory cell 102a and a second split gate flash memory cell 102b. The semiconductor structure can, for example, represent an integrated circuit (IC). The split gate flash memory cells 102 are, for example, SONOS or MONOS split gate flash memory cells. The split gate flash memory cells 102 are formed on and/or with a semiconductor substrate 104 and encapsulated by an interlayer dielectric 106.

A source/drain region 108 shared by the split gate flash memory cells 102 and two source/drain regions 110a, 110b individual to the split gate flash memory cells 102 are embedded within the semiconductor substrate 104. The shared and individual source/drain regions 108, 110 may be of the same type (i.e., n- or p-type) and of the opposite type as the semiconductor substrate 104. Alternatively, the shared and individual source/drain regions 108, 110 may be of opposite type as a well region or active region in which the split gate flash memory cells 102 are formed. Further, the shared and individual source/drain regions 108, 110 are embedded within a top surface, typically a planar top surface, of the semiconductor substrate 104 (e.g., by doping) and are spaced to define a channel region 112a, 112b between each individual source/drain region 110 and the shared source/drain region 108. The channel regions 112 correspond to the different split gate flash memory cells 102 of the pair.

Conductive contacts 114a, 114b individual to the split gate flash memory cells 102 extend vertically down through the interlayer dielectric 106 to contact pads 116a, 116b individual to the split gate flash memory cells 102 and arranged over the individual source/drain regions 110. Further, a conductive contact 118 shared by the split gate flash memory cells 102 extends vertically down through the interlayer dielectric 106 to a contact pad 120 shared by the split gate flash memory cells 102 and arranged over the shared source/drain region 108. The shared and individual contact pads 116, 120 are typically silicide, such as, for example, nickel silicide. Further, the shared and individual conductive contacts 114, 118 are, for example, be formed of one or more of titanium, titanium nitride, and tungsten.

Over each channel region 112, the semiconductor structure includes a select gate 122a, 122b and a memory gate 124a, 124b spaced between the shared source/drain region 108 and the individual source/drain region 110 of the channel region 112. The select gate 122 is arranged proximate to the shared source/drain region 108, and the memory gate 124 is arranged proximate to the individual source/drain region 110. The select gate 122 typically has a generally rectangular profile. Further, the select gate 122 typically has a damage-free sidewall (i.e., a sidewall without recesses, dents, imperfections, and the like) facing the shared source/drain region 108. The memory gate 124 typically has a generally asymmetrical, stepped profile and is recessed proximate to the individual source/drain region 110 to define a memory gate ledge 126a, 126b. The memory gate ledge 126 exhibits a reduced height relative to a top surface of the memory gate 124 and runs along a memory gate edge facing the individual source/drain region 110. For a SONOS split gate flash memory cell, the memory gate is formed from a silicon based material, such as polysilicon, and for a MONOS split gate flash memory cell, the memory gate is formed from a metal or metal alloy.

A spacer 128a, 128b extends vertically up from the memory gate ledge 126, along and abutting an upper, inner sidewall of the memory gate 124, to cover the upper sidewall of the memory gate 124. In some embodiments, the spacer 128 extends vertically up to approximately even with the top surface of the select gate 122. A top sealer 130a, 130b is arranged to cover the top surface of the memory gate 124. In some embodiments, the top sealer 130 includes a top surface approximately coplanar with the top surface of the select gate 122. Further, in some embodiments, the top sealer 130 extends over the top surface of the memory gate 124 from the spacers 128. A side sealer 132a, 132b is arranged to cover a lower, outer sidewall of the memory gate 124 proximate to the individual source/drain region 110. In some embodiments, the side sealer 132 extends vertically up from approximately even with a bottom surface of the memory gate 124, along and abutting sidewalls of the memory gate 124 and the spacer 128, to approximately even with the top surface of the select gate 122. The top and side sealers 130, 132, as well as the spacer 128, are typically dielectrics, such as silicon nitride.

Arranged between the semiconductor substrate 104 and the select gate 122, a gate dielectric 134a, 134b electrically isolates the select gate 122 from the semiconductor substrate 104. Arranged between the semiconductor substrate 104 and the memory gate 124, a charge trapping dielectric 136a, 136b electrically isolates the memory gate 124 from the semiconductor substrate 104. The charge trapping dielectric 136 further extends vertically up to fill the space between the memory gate 124 and the select gate 122 and to electrically isolate the memory gate 124 from the select gate 122. In some embodiments, the charge trapping dielectric 136 extends vertically up to approximately even with the top surface of the select gate 122. Further, in some embodiments, the charge trapping dielectric 136a, 136b further extends between the side sealer 132 and the semiconductor substrate 104, and/or between the top sealer 130 and the select gate 122. The gate dielectric 134 is, for example, an oxide, such as silicon dioxide, and the charge trapping dielectric 136 is, for example, a multilayer dielectric, such as an oxide-nitride-oxide (ONO) dielectric or an oxide-silicon dot-oxide (OSiO) dielectric. For readability, layers of the charge trapping dielectric 136 are not individually labeled.

A peripheral sidewall structure 138 extends from the semiconductor substrate 104, along and abutting sidewalls of the charge trapping dielectric 136 and the side sealer 132, to cover the sidewalls of the charge trapping dielectric 136 and the side sealer 132. In some embodiments, a peripheral sidewall dielectric 139a, 139b is arranged between the peripheral sidewall structure 138 and the semiconductor substrate 104. The peripheral sidewall dielectric 139 is, for example, a native oxide. Further, a central sidewall structure 140a, 140b extends generally parallel to a sidewall of the select gate 122 facing the shared source/drain region 108. In some embodiments, the central sidewall structure 138 extends to approximately even with the top surface of the select gate 122. The peripheral and central sidewall structure 138, 140 are, for example, dielectrics, such as silicon nitride.

Arranged between the select gate 122 and the central sidewall structure 140, a central sidewall dielectric 142a, 142b extends vertically up to fill the space between the select gate 122 and the central sidewall structure 138, and to space the central sidewall structure 140 from select gate 122. The central sidewall dielectric 142 further extends horizontally under the central sidewall structure 140 so the central sidewall structure 140 rests upon the central sidewall dielectric 142. Hence, the dielectric region arranged between the central sidewall structure 140 and the semiconductor substrate 104 (i.e., the dielectric region extending from approximately even with the top surface of the semiconductor substrate 104 to approximately even with the bottom surface of the central sidewall structure 140) is thicker than any dielectric region arranged between the peripheral sidewall structure 138 and the semiconductor substrate 104 (i.e., the dielectric region extending from approximately even with the top surface of the semiconductor substrate 104 to approximately even with the bottom surface of the peripheral sidewall structure 138). The bottom surface of the central sidewall structure 140 is higher than the bottom surface of the peripheral sidewall structure 138. This variation in thickness is unique to semiconductor structures formed according to the method described hereafter. The central sidewall dielectric 142 is, for example, an oxide, such as silicon dioxide.

In operation, each split gate flash memory cells 102 stores a variable amount of charge, such as electrons, in the charge trapping dielectric 136. The charge is advantageously stored in a non-volatile manner so that the stored charge persists in the absence of power. The amount of charge stored in the charge trapping dielectric 136 represents a value, such as binary value, and is varied through program (i.e., write), read, and erase operations. These operations are performed through selective biasing of the select gate 122 and the memory gate 124.

During a program operation of a split gate flash memory cell 102, a positive voltage is applied to the memory gate 124 that is high (e.g., at least an order of magnitude higher) relative a voltage applied across the channel region 112 and/or relative to a voltage applied to the select gate 122. The high positive voltage promotes Fowler-Nordheim tunneling of carriers from the channel region 112 towards the memory gate 124. As the carriers tunnel towards the memory gate 124, the carriers become trapped in the charge trapping dielectric 136.

During an erase operation of a split gate flash memory cell 102, a negative voltage is applied to the memory gate 124 that is high (e.g., at least an order of magnitude higher) relative to a voltage applied across the channel region 112 and/or relative to a voltage applied to the select gate 122. The high negative voltage promotes Fowler-Nordheim tunneling of carriers in the charge trapping dielectric 136 away from the memory gate 124. As the carriers tunnel away from the memory gate 124, the carriers become dislodged or otherwise removed from the charge trapping dielectric 136.

Charge stored in the charge trapping dielectric 136 screens an electric field formed between the memory gate 124 and the channel region 112 when the memory gate 124 is biased. This has an effect of increasing the threshold voltage $V_{th}$ of the split gate flash memory cell 102 by an amount $\Delta V_{th}$. During a read operation of a split gate flash memory cell 102, a voltage is applied to the select gate 122 to induce part of the channel region 112 to conduct. Application of a voltage to the select gate 122 attracts carriers to part of the channel region 112 adjacent to the select gate 122. Further, a voltage greater than $V_{th}$, but less than $V_{th}+\Delta V_{th}$, is applied to the memory gate 124. If the split gate flash memory cell 102 turns on (i.e., allows charge to flow), then it stores a first data state (e.g., a logical "0"). If the split gate flash memory cell 102 does not turn on, then it stores a second data state (e.g., a logical "1").

Figure 2:
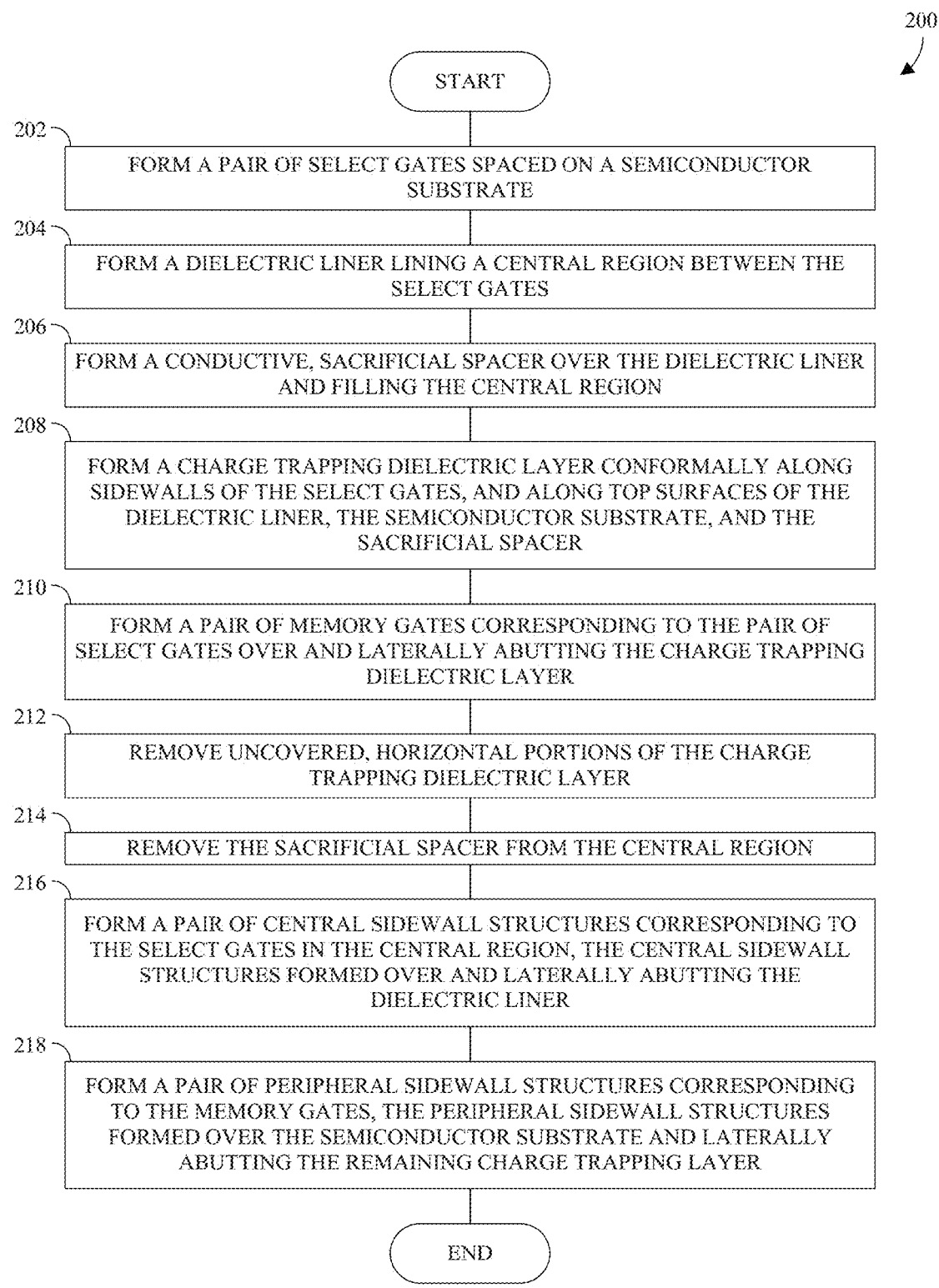
FIG. 2 illustrates a flow chart of some embodiments of a method of manufacturing a semiconductor structure for a pair of split gate flash memory cells, the semiconductor structure free of select gate sidewall damage.

With reference to FIG. 2, a flow chart 200 of some embodiments of a method for manufacturing the semiconductor structure is provided. According to the method, a pair of select gates spaced on a semiconductor substrate is formed (Action 202). A dielectric liner lining a central region between the select gates is formed (Action 204), and a conductive, sacrificial spacer is formed (Action 206) over the dielectric liner and filling the central region. In some embodiments, top surfaces of the dielectric liner and the sacrificial spacer are coplanar with top surfaces of the select gates. A charge trapping dielectric layer is formed (Action 208) conformally along sidewalls of the select gates, and along top surfaces of the dielectric liner, the semiconductor substrate, and the sacrificial spacer. Hence, the charge trapping dielectric layer extends linearly over the central region between the select gates.

A pair of memory gates corresponding to the pair of select gates is formed (Action 210) over and laterally abutting the charge trapping dielectric layer. Uncovered, horizontal portions of the charge trapping dielectric layer are removed (Action 212), while leaving portions of the charge trapping dielectric layer arranged between neighboring sidewalls of the select gates and the memory gates and arranged between the semiconductor substrate and the memory gates. Advantageously, removing the horizontal portions of the charge trapping dielectric layer results in damage free sidewalls of the select gates and/or the gate dielectrics disposed between the select gates and the semiconductor structure.

The sacrificial spacer is removed (Action 214) from the central region, and a pair of central sidewall structures corresponding to the select gates are formed (Action 216) in the central region. The central sidewall structures are formed over and laterally abutting the dielectric liner. A pair of peripheral sidewall structures corresponding to the memory gates are formed (Action 218). The peripheral sidewall structures are formed over the semiconductor substrate and laterally abutting the remaining charge trapping dielectric layer. The thickness of the dielectric region between the central sidewall structures and the semiconductor substrate is greater than any dielectric region between the peripheral sidewall structures and the semiconductor substrate.

Figure 3A:
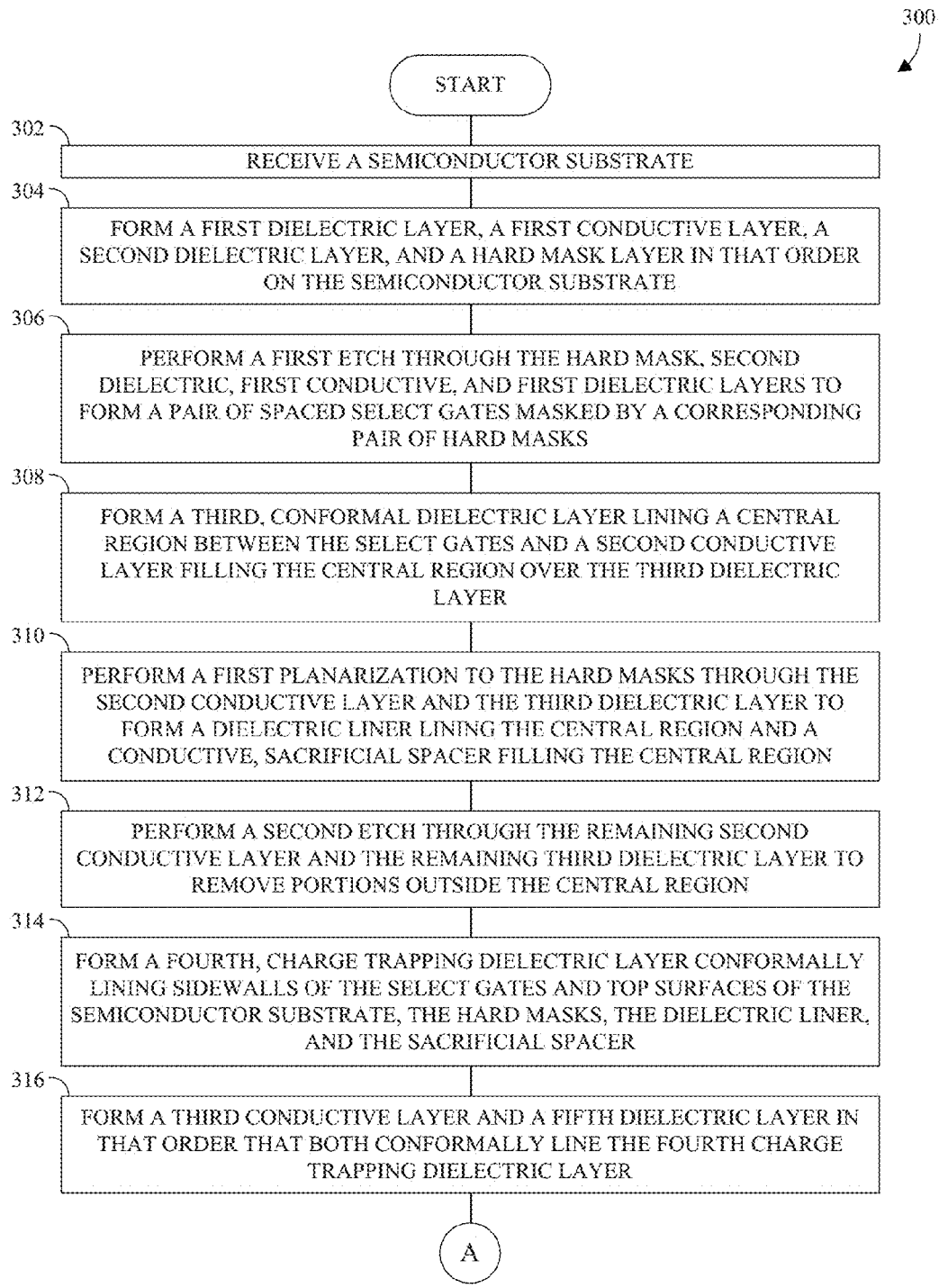
FIGS. 3A & B illustrate flow charts of some embodiments of a method of manufacturing a semiconductor structure for a pair of split gate flash memory cells, the semiconductor structure free of select gate sidewall damage.
Figure 3B:
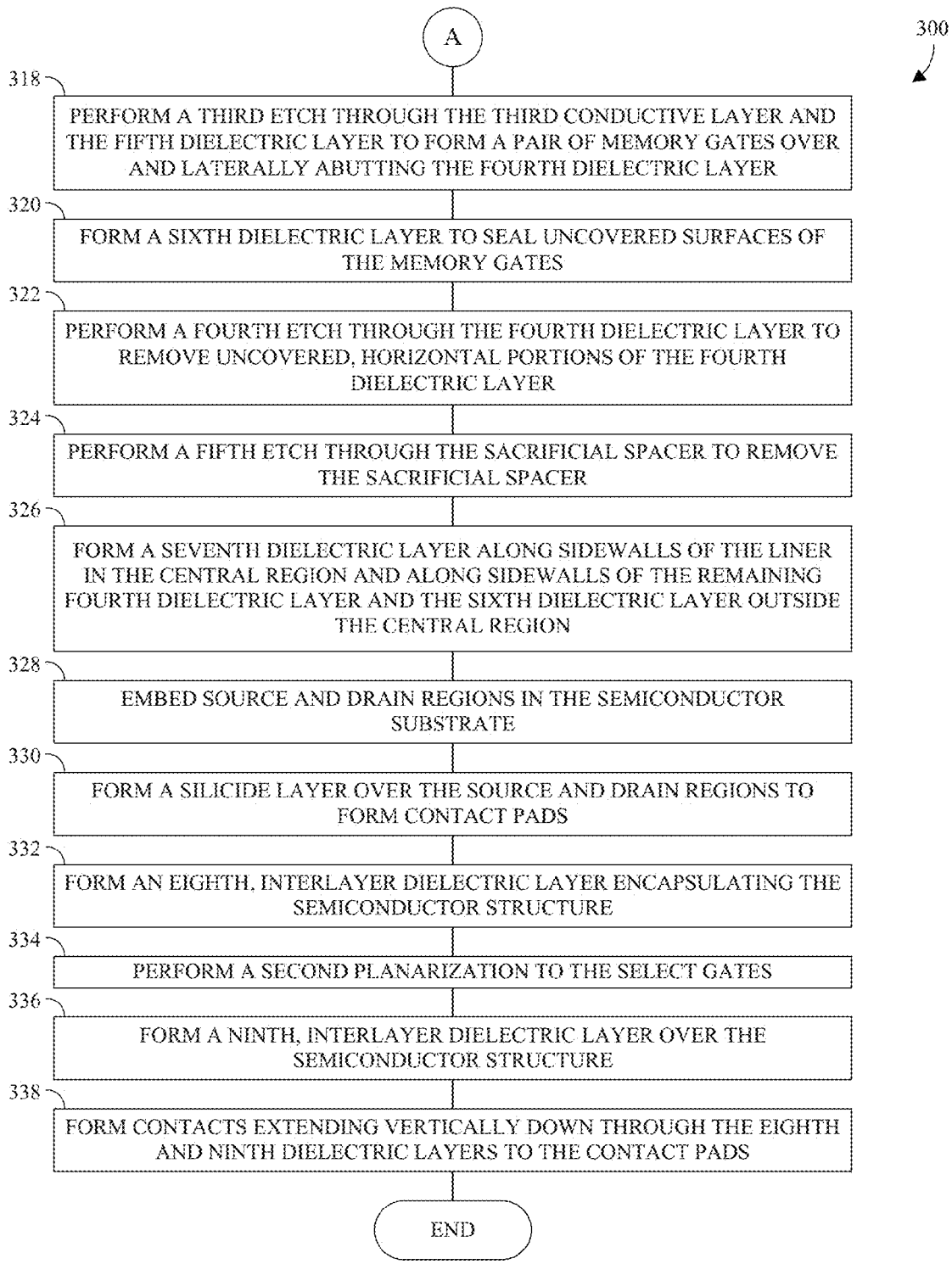

With reference to FIG. 3, a flow chart 300 of some embodiments of an expanded method for manufacturing the semiconductor structure is provided. According to the method, a semiconductor substrate is received (Action 302). A first dielectric layer, a first conductive layer, a second dielectric layer, and a hard mask layer are formed (Action 304) in that order on the semiconductor substrate. A first etch is performed (Action 306) through the hard mask, second dielectric, first conductive, and first dielectric layers to form a pair of spaced select gates masked by a corresponding pair of hard masks.

A third, conformal dielectric layer lining a central region between the select gates and a second conductive layer filling the central region over the third dielectric layer are formed (Action 308). A first planarization is performed (Action 310) to the hard masks through the second conductive layer and the third dielectric layer to form a dielectric liner lining the central region and a conductive, sacrificial spacer filling the central region. A second etch is performed (Action 312) through the remaining second conductive layer and the remaining third dielectric layer to remove portions outside the central region. A fourth, charge trapping dielectric layer is formed (Action 314) that conformally lines sidewalls of the select gates and top surfaces of the semiconductor substrate, the hard masks, the dielectric liner, and the sacrificial spacer. Because of the dielectric liner and the sacrificial spacer, the fourth charge trapping dielectric layer does not conformally line the central region.

A third conductive layer and a fifth dielectric layer are formed (Action 316) in that order that both conformally line the fourth charge trapping dielectric layer. A third etch is performed (Action 318) through the third conductive layer and the fifth dielectric layer to form a pair of memory gates over and laterally abutting the fourth dielectric layer. A sixth dielectric layer is formed (Action 320) to seal uncovered surfaces of the memory gates. A fourth etch is performed (Action 322) through the fourth dielectric layer to remove uncovered, horizontal portions of the fourth dielectric layer, while leaving portions of the fourth dielectric layer arranged between neighboring sidewalls of the select gates and the memory gates and arranged between the semiconductor substrate and the memory gates. Advantageously, performing the fourth etch results in damage free sidewalls of the select gates and/or the gate dielectrics disposed between the select gates and the semiconductor structure.

A fifth etch is performed (Action 324) through the sacrificial spacer to remove the sacrificial spacer. A seventh dielectric layer is formed (Action 326) along sidewalls of the dielectric liner in the central region and along sidewalls of the remaining fourth dielectric layer and the sixth dielectric layer outside the central region. Because the seventh dielectric layer is formed over the dielectric liner, the thickness of the dielectric region between the seventh dielectric layer and the semiconductor substrate is greater in the central region than the thickness of any dielectric region between the seventh dielectric layer and the semiconductor substrate outside the central region. Source and drain regions are embedded (Action 328) in the semiconductor substrate, and a silicide layer is formed (Action 330) over the source and drain regions to form contact pads. An eighth, interlayer dielectric layer encapsulating the semiconductor structure is formed (Action 332), and a second planarization is performed (Action 334) to the select gates. A ninth, interlayer dielectric layer is formed (Action 336) over the semiconductor structure, and contacts are formed (Action 338) extending vertically down through the eighth and ninth dielectric layers to the contact pads.

Methods to forming the semiconductor structure of a pair of SONOS or MONOS split gate flash memory cells other than those of the present disclosure do not form the dielectric liner and the conductive, sacrificial spacer. As such, the charge trapping dielectric layers of such methods conformally line the central regions between the split gates. Further, the formation of the memory gates results in leftover conductive material in the central regions that must be removed.

When removing the leftover conductive material in a central region, portions of the charge trapping dielectric layer within the central region are reduced in thickness relative to portions of the charge trapping dielectric layer outside the central region. For example, portions of the charge trapping dielectric layer outside the central region are masked, while portions of the charge trapping dielectric layer within the central region are not. An etch is then performed according to the mask to remove the leftover conductive material, and the etch partially etches portions of the charge trapping dielectric layer within the central region. Because of the reduced thickness of portions of the charge trapping dielectric layer within the central region, sidewalls of the select gates, and/or sidewalls of gate dielectrics disposed between the select gates and the semiconductor structure, are damaged when subsequently removing uncovered portions of the charge trapping dielectric layer. The thinner portions of the charge trapping dielectric layer within the central region are etched away faster than the thicker portions of the charge trapping dielectric layer outside the central region. Hence, during the period between when the thinner portions of the charge trapping layer within the central region are fully etched away and when the thicker portions of the charge trapping layer outside the central region are fully etched away, the select gates and/or the gate dielectrics are etched.

In view of the foregoing, it should be appreciated that the methods of the present disclosure address eliminate the foregoing sidewall damage by eliminating the removal of portions of the charge trapping dielectric layer within a central region between control gates. Namely, the central region between the select gates is filled (e.g., by the dielectric liner and the conductive, sacrificial spacer) before forming the charge trapping dielectric layer.

While the disclosed methods (e.g., the methods described by the flowchart 200, 300) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

With reference to FIGS. 4-20, cross-sectional views of some embodiments of the semiconductor structure at various stages of manufacture are provided to illustrate the expanded method. Although FIGS. 4-20 are described in relation to the expanded method, it will be appreciated that the structures disclosed in FIGS. 4-20 are not limited to the expanded method, but instead may stand alone as structures independent of the expanded method. Similarly, although the expanded method is described in relation to FIGS. 4-20, it will be appreciated that the expanded method is not limited to the structures disclosed in FIGS. 4-20, but instead may stand alone independent of the structures disclosed in FIGS. 4-20.

Figure 4:
FIGS. 4-20 illustrate a series of cross-sectional views of some embodiments of a semiconductor structure at various stages of manufacture for a pair of split gate flash memory cells, the semiconductor structure free of select gate sidewall damage.

FIG. 4 illustrates a cross-sectional view 400 of some embodiments corresponding to Action 302. As shown by FIG. 4, a semiconductor substrate 104 is received. The semiconductor substrate 104 is typically planar with a uniform thickness. Further, the semiconductor substrate 104 is n- or p-type, and can, for example, be a handle wafer, such as a Si wafer or a silicon-on-insulator (SOI) substrate. If present, an SOI substrate is often made up of an active layer of high quality silicon in which split gate flash memory cells 102 are formed. In such instances, the split gate flash memory cells 102 are arranged over a buried layer (BOX) of electrically insulating silicon dioxide, which is arranged over a bulk silicon support substrate.

Figure 5:
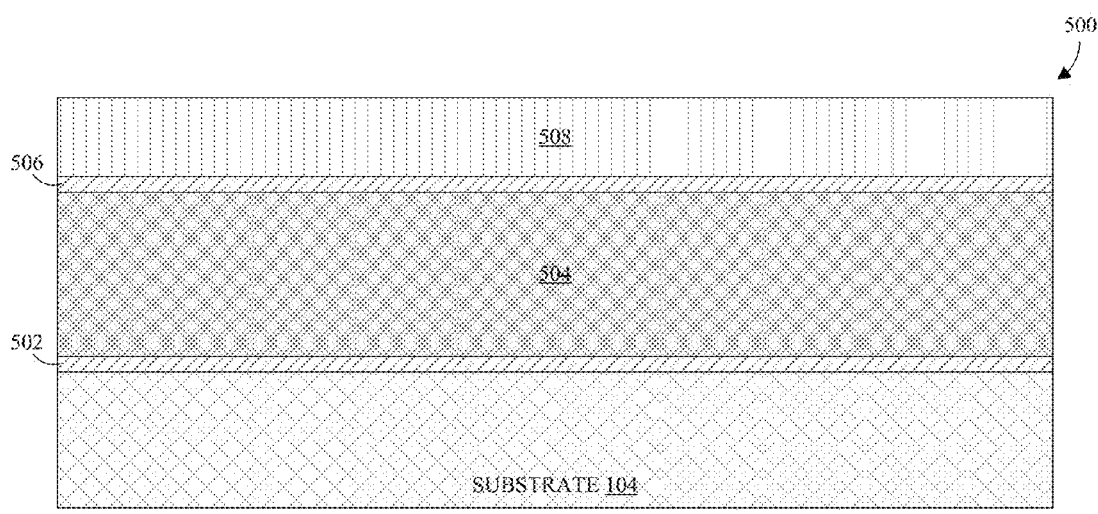

FIG. 5 illustrates a cross-sectional view 500 of some embodiments corresponding to Action 304. As shown by FIG. 5, a first dielectric layer 502, a first conductive layer 504, a second dielectric layer 506, and a hard mask layer 508 are stacked or formed in that order over a top surface of the semiconductor substrate 104. Each of the layers 502-508 typically has a uniform thickness. The first and second dielectric layers 502, 506 are, for example, an oxide, such as silicon dioxide. The first conductive layer 504 is formed from a silicon based material, such as polysilicon, for a SONOS split gate flash memory cell, and the first conductive layer 504 is formed from a metal or metal alloy for a MONOS split gate flash memory cell. The hard mask layer is 508, for example, a nitride or a multilayer nitride-oxide-nitride (NON) film.

Figure 6:
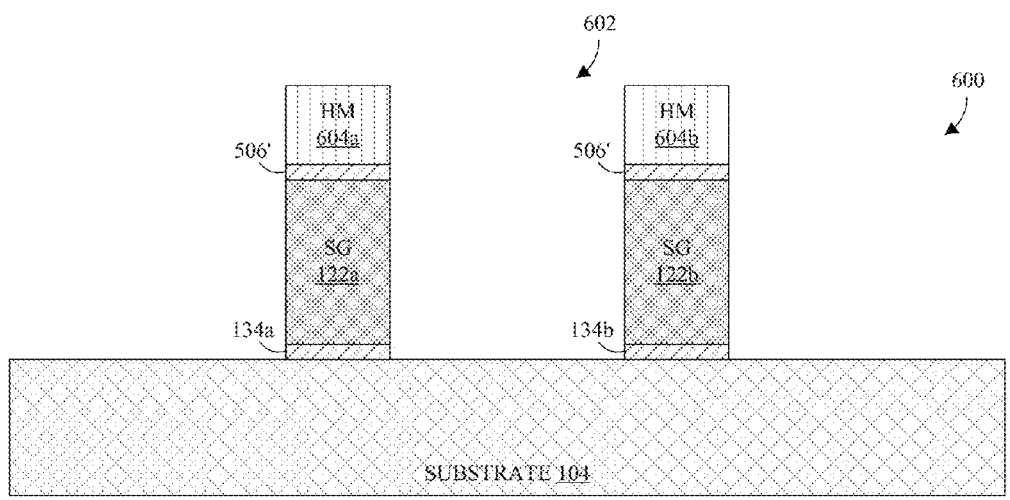

FIG. 6 illustrates a cross-sectional view 600 of some embodiments corresponding to Action 306. As shown by FIG. 6, a first etch is performed through the hard mask, second dielectric, first conductive, and first dielectric layers 502-508 to form a pair of spaced select gates 122a, 122b. The select gates 122 form a central region 602 between the select gates 122 and rest upon gate dielectrics 134a, 134b electrically isolating the select gates 122 from the semiconductor substrate 104. Further, the select gates 122 are masked by hard masks 604a, 604b electrically isolated from the select gate 122a, 122b by the remaining second dielectric layer 506'.

Figure 7:
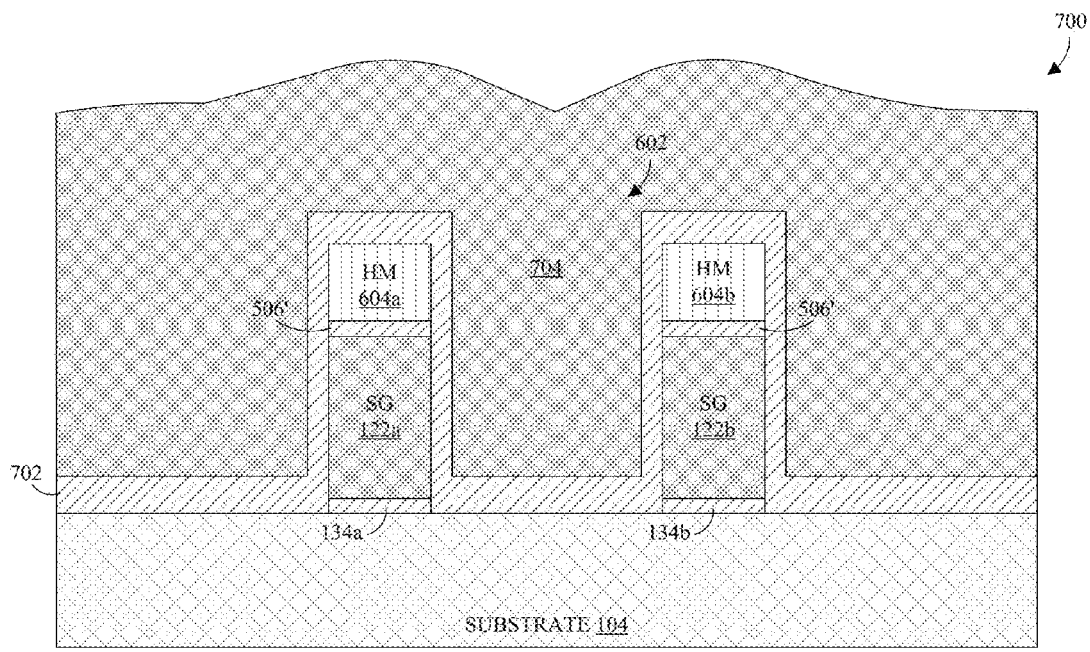

FIG. 7 illustrates a cross-sectional view 700 of some embodiments corresponding to Action 308. As shown by FIG. 7, a third dielectric layer 702 and a second conductive layer 704 are stacked or formed in that order over the semiconductor structure. The third dielectric layer 702 is conformally formed over the semiconductor structure to line the central region 602 between the select gates 122. In some embodiments, the third dielectric layer 702 is conformally formed: over the top surface of the semiconductor substrate 104; along sidewalls of the gate dielectrics 134, the select gates 122, the remaining second dielectric layer 506', and the hard masks 604; and over the top surface of the hard masks 604. The second conductive layer 704 is formed over the third dielectric layer 702 to fill the central region 602. The third dielectric layer 702 is, for example, an oxide, such as silicon dioxide, and the second conductive layer 704 is, for example, polysilicon.

Figure 8:
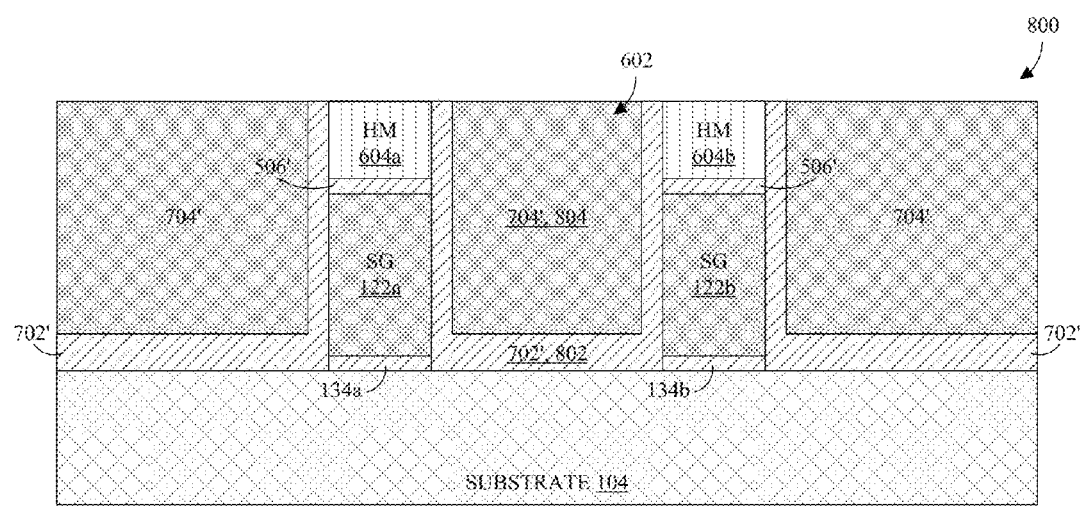

FIG. 8 illustrates a cross-sectional view 800 of some embodiments corresponding to Action 310. As shown by FIG. 8, a first planarization is performed to the hard masks 604 through the third dielectric layer 702 and the second conductive layer 704. The first planarization forms a dielectric liner 802 lining the central region 602 and a conductive, sacrificial spacer 804 filling the central region 602. The dielectric liner 802 is formed in the remaining third dielectric layer 702', and the sacrificial spacer 804 is formed in the remaining second conductive layer 704'. Typically, both the dielectric liner 802 and the sacrificial spacer 804 have top surfaces coplanar with top surfaces of the hard masks 604. The first planarization can, for example, be performed using a chemical machine polish (CMP).

Figure 9:
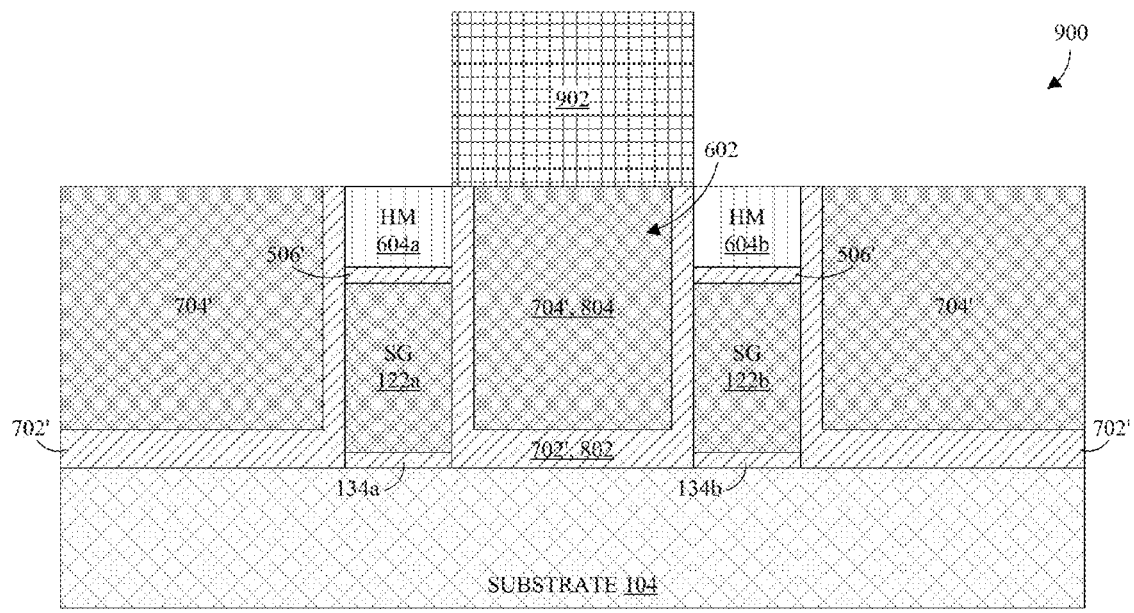
Figure 10:
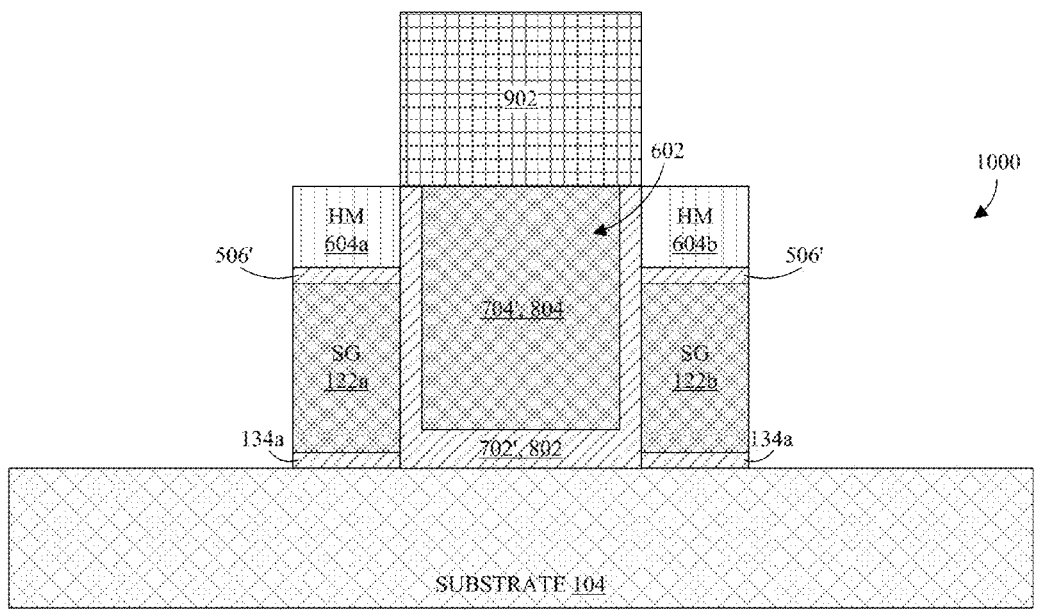
Figure 11:
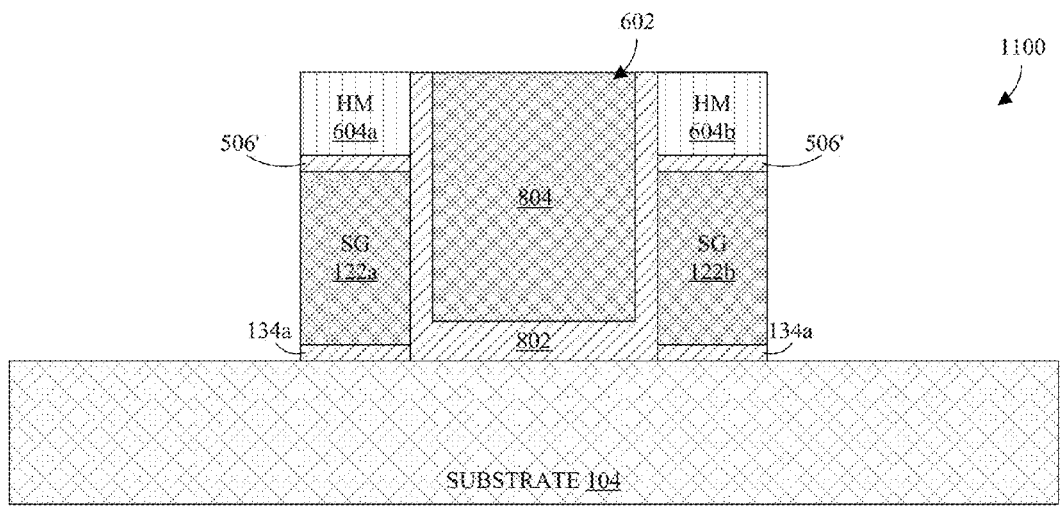

FIGS. 9-11 illustrate cross-sectional views 900, 1000, 1100, respectively, of some embodiments corresponding to Action 312. As shown by FIG. 9, a mask 902 is formed on the remaining third dielectric layer 702' and the remaining second conductive layer 704' to mask or otherwise cover portions of the remaining third dielectric layer 702' and the remaining second conductive layer 704' within the central region 602. In other words, the dielectric liner 802 and the sacrificial spacer 804 are masked, while leaving other portions of the remaining third dielectric layer 702' and the remaining second conductive layer 704' unmasked. The mask 902 is, for example, a photoresist and is formed by, for example, photolithography. As shown by FIG. 10, a second etch is performed through the remaining third dielectric layer 702' and the remaining second conductive layer 704' to remove portions unmasked by the mask 902. As shown by FIG. 11, the mask 902 is removed by, for example, plasma ashing.

Figure 12:
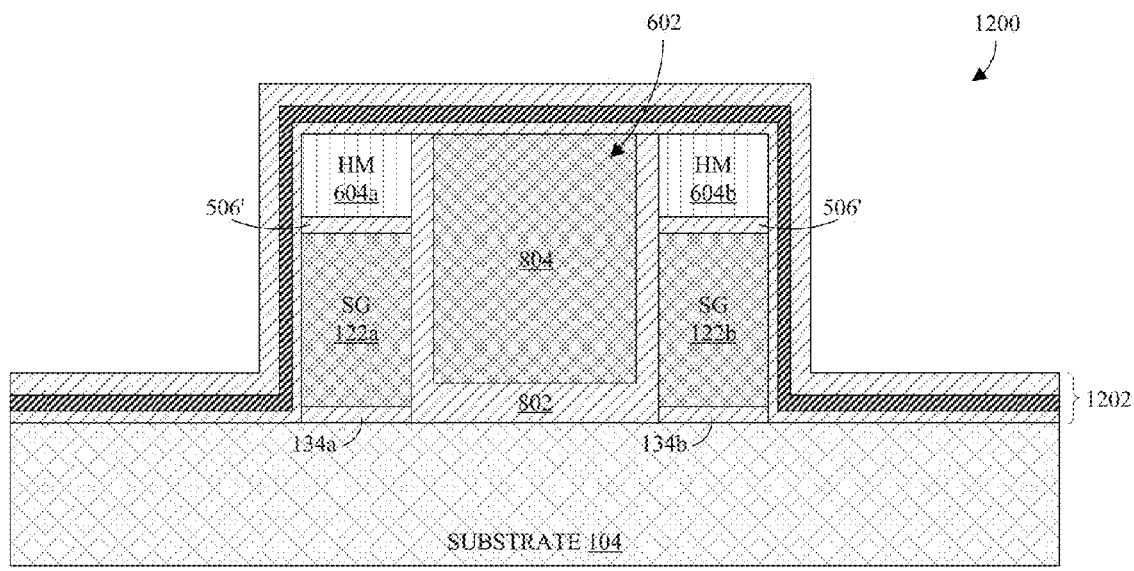

FIG. 12 illustrates a cross-sectional view 1200 of some embodiments corresponding to Action 314. As shown by FIG. 12, a fourth, charge trapping dielectric layer 1202 is conformally formed over the semiconductor structure. The fourth dielectric layer 1202 is conformally formed: over the top surface of the semiconductor substrate 104; along sidewalls of the gate dielectrics 134, the select gates 122, the remaining second dielectric layer 506', and the hard masks 604; and over the top surface of the hard masks 604, the dielectric liner 802, and the sacrificial spacer 804. In contrast, known methods to forming split gate flash memory cells form the fourth dielectric layer 1202 to conformally line the central region 602 since known methods do not fill the central region 602 before forming the fourth dielectric layer 1202. The fourth dielectric layer 1202 is, for example, a multilayer charge trapping dielectric, such as an oxide-nitride-oxide (ONO) dielectric or an oxide-silicon dot-oxide (OSiO) dielectric. For readability, layers of the fourth dielectric layer 1202 are not individually labeled.

Figure 13:
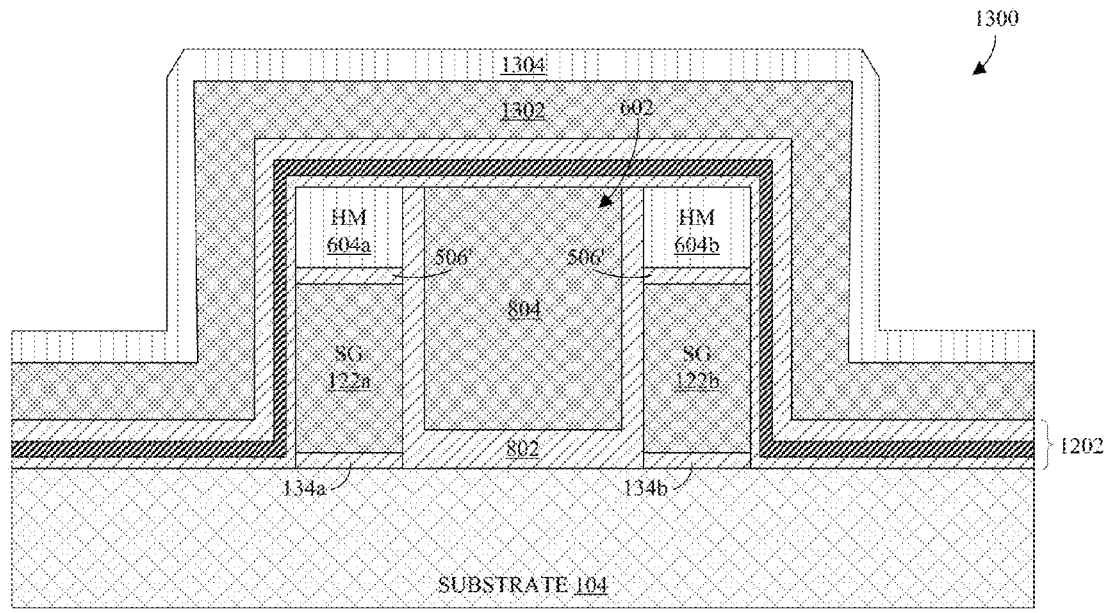

FIG. 13 illustrates a cross-sectional view 1300 of some embodiments corresponding to Action 316. As shown by FIG. 13, a third conductive layer 1302 and a fifth dielectric layer 1304 are stacked or formed in that order over the fourth, charge trapping dielectric layer 1202. The third conductive layer 1302 is conformally formed over the fourth dielectric layer 1202, and the fifth dielectric layer 1304 is conformally formed over the third conductive layer 1302. The third conductive layer 1302 is, for example, polysilicon, and the fifth dielectric layer 1304 is, for example, silicon nitride.

Figure 14:
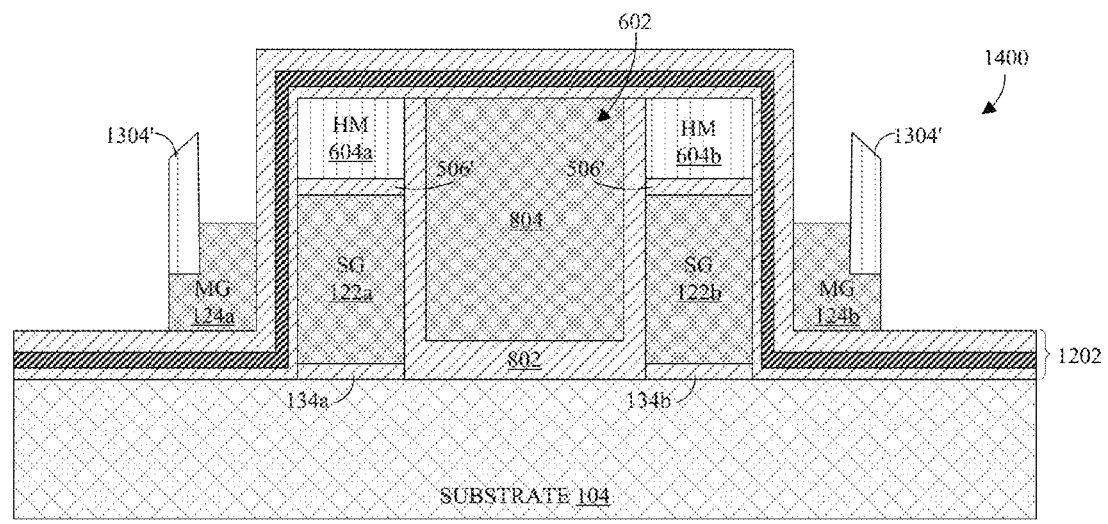

FIG. 14 illustrates a cross-sectional view 1400 of some embodiments corresponding to Actions 318. As shown by FIG. 14, a third etch is performed through the third conductive layer 1302 and the fifth dielectric layer 1304 to form a pair of memory gates 124a, 124b over and laterally abutting the fourth dielectric layer 1202. In some embodiments, the third etch includes multiple individual etches of the third conductive layer 1302 and/or the fifth dielectric layer 1304

Figure 15:
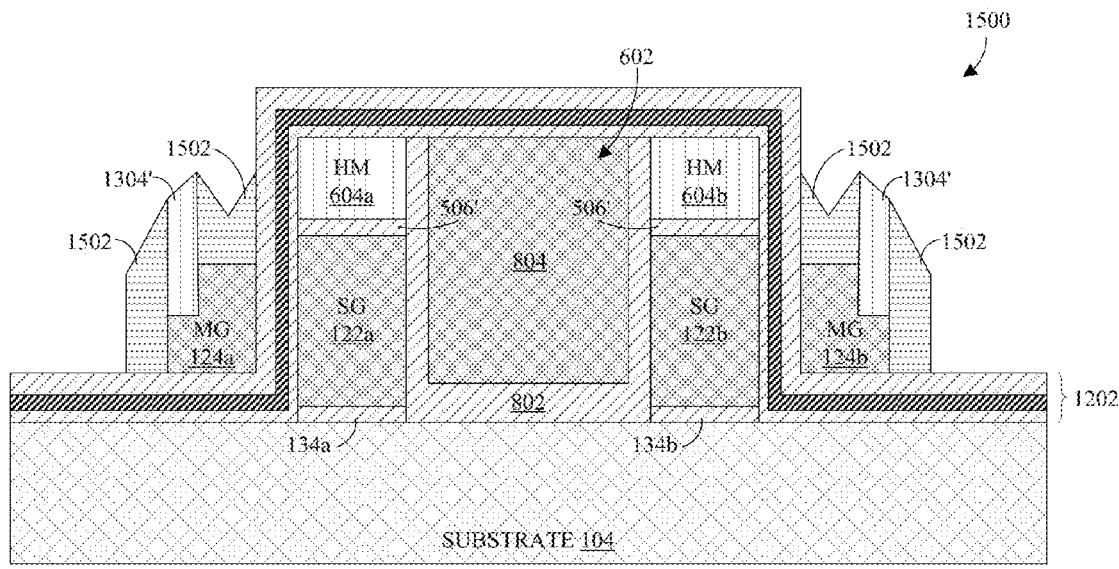

FIG. 15 illustrates a cross-sectional view 1500 of some embodiments corresponding to Actions 320. As shown by FIG. 15, a sixth dielectric layer 1502 is formed to seal or otherwise cover uncovered surfaces of the memory gates 124. For example, an intermediate dielectric layer can be deposited and selectively etched to form the sixth dielectric layer 1502. The sixth dielectric layer 1502 is, for example, silicon nitride.

Figure 16:
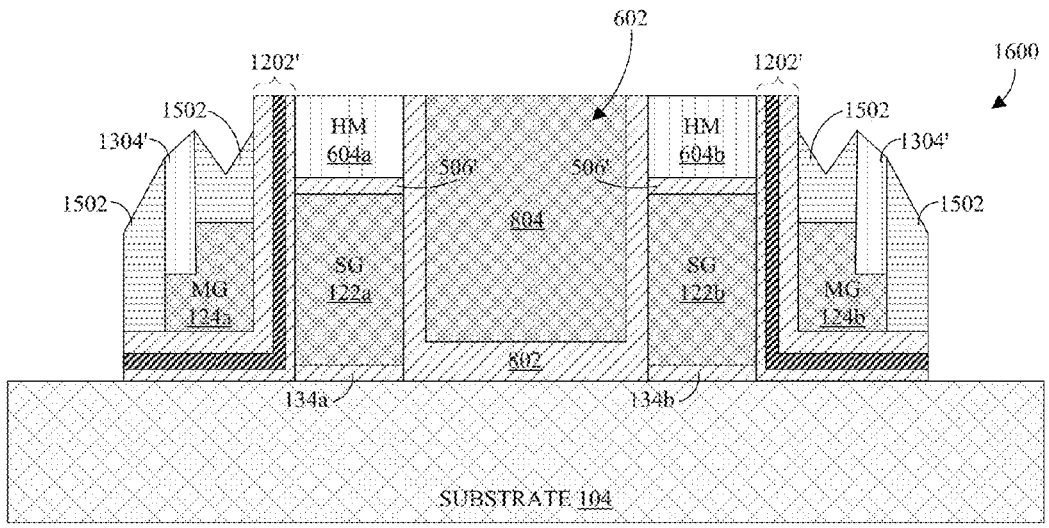

FIG. 16 illustrates a cross-sectional view 1600 of some embodiments corresponding to Actions 322. As shown by FIG. 16, a fourth etch is performed through the fourth dielectric layer 1202 to remove uncovered, horizontal portions of the fourth dielectric layer 1202. In some embodiments, the uncovered portions of the fourth dielectric layer 1202 include portions covering the hard masks 604, the dielectric liner 802, and the sacrificial spacer 804. The fourth etch can, for example, be a fully dry etch, a fully wet etch, or a combination wet and dry etch.

Figure 17:
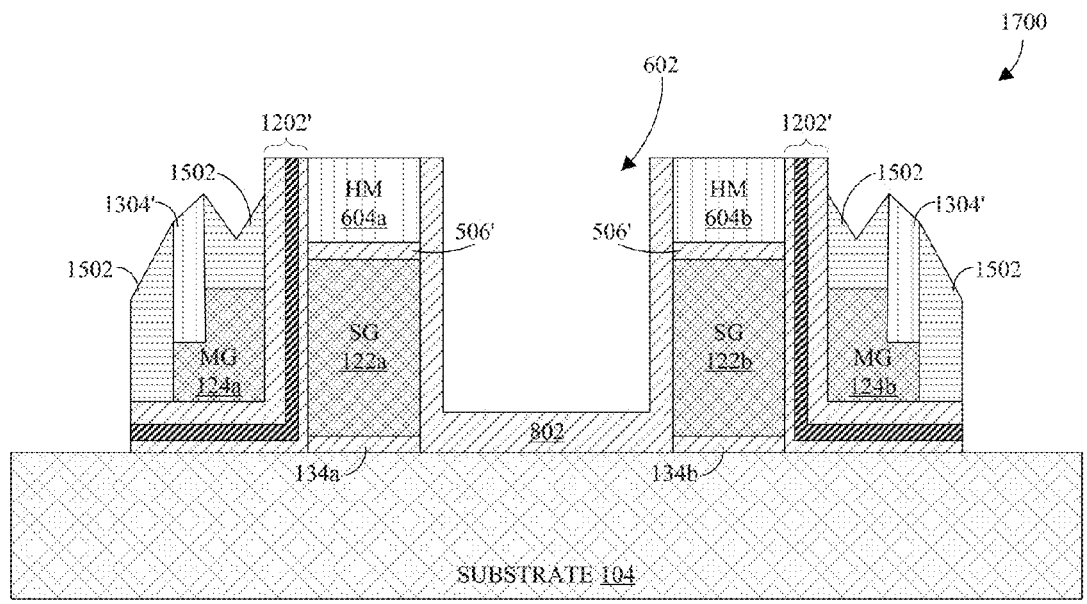

FIG. 17 illustrates a cross-sectional view 1700 of some embodiments corresponding to Actions 324. As shown by FIG. 17, a fifth etch is performed through the sacrificial spacer 804 to remove the sacrificial spacer 804.

Figure 18:
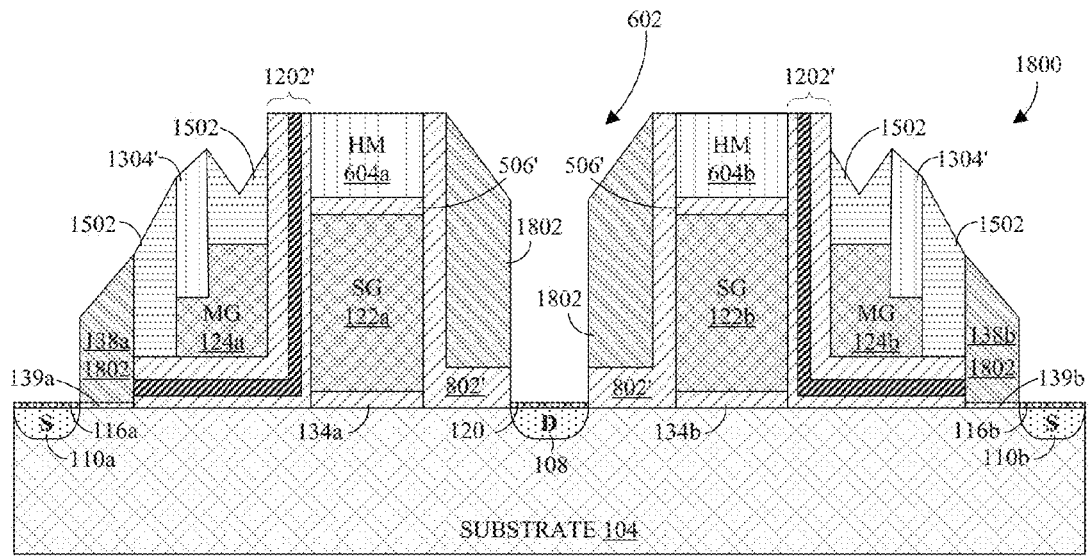

FIG. 18 illustrates a cross-sectional view 1800 of some embodiments corresponding to Actions 326-330. As shown by FIG. 18, a seventh dielectric layer 1802 is formed along sidewalls of the dielectric liner 802 in the central region 602 and along sidewalls of the remaining fourth dielectric layer 1202' and the sixth dielectric layer 1502 outside the central region 602. For example, an intermediate dielectric layer can be deposited and selectively etched to form the seventh dielectric layer 1802. The portions of the seventh dielectric layer 1802 lining sidewalls outside the central region 602 form peripheral sidewall structures 138a, 138b. The seventh dielectric layer 1802 is, for example, silicon nitride.

Also shown by FIG. 18, a peripheral sidewall dielectric 139a, 139b is formed between the peripheral sidewall structure 138 and the semiconductor substrate 104. In some embodiments, the peripheral sidewall dielectric 139 is grown natively as an oxide on exposed portions of the semiconductor substrate 104 during the interim between performing the fifth etch and forming the seventh dielectric layer 1802. Further, source and drain regions 108, 110a, 110b are embedded within the semiconductor substrate 104, and a silicide layer is formed over the source and drain regions 108, 110 to form contact pads 116a, 116b, 120. The embedding typically includes etching through the dielectric liner 802 to the semiconductor substrate 104 in the central region 602. The silicide layer is, for example, nickel silicide.

Figure 19:
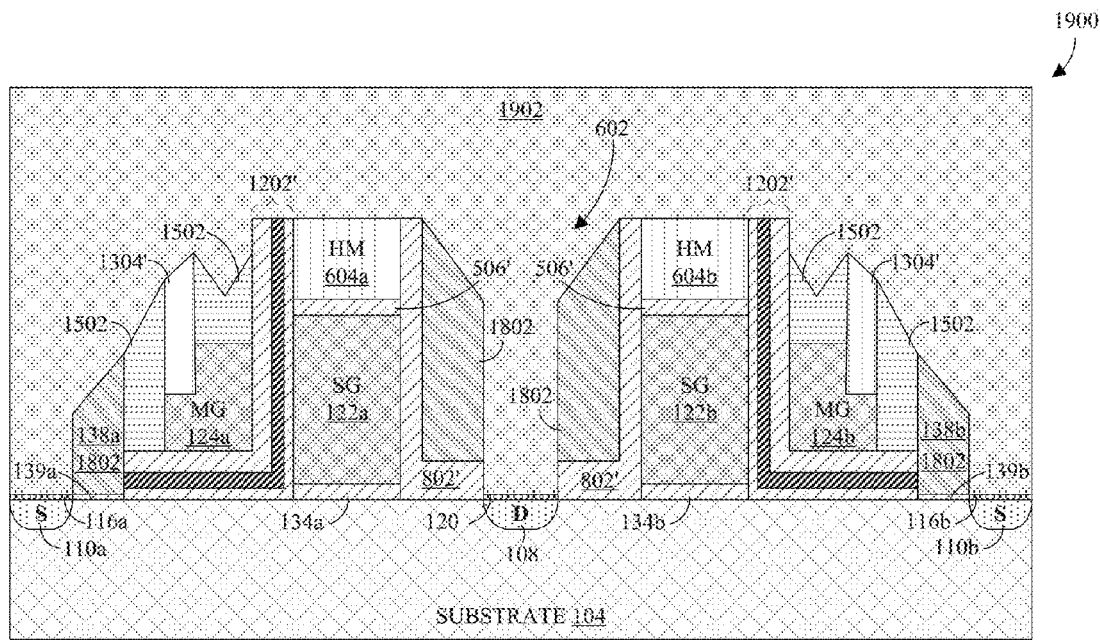

FIG. 19 illustrates a cross-sectional view 1900 of some embodiments corresponding to Action 332. As shown by FIG. 19, an eighth, interlayer dielectric layer 1902 is formed that encapsulates the semiconductor structure. The eighth dielectric layer 1902 is, for example, an oxide, such as silicon dioxide.

Figure 20:
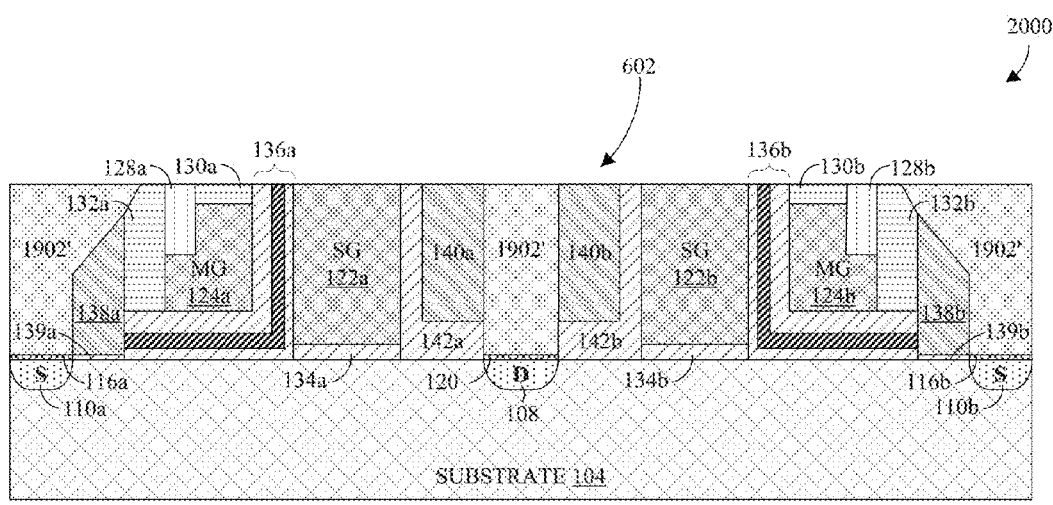

FIG. 20 illustrates a cross-sectional view 2000 of some embodiments corresponding to Action 334. As shown by FIG. 20, a second planarization is performed to the select gates 122 through the sixth, seventh and eighth dielectric layers 1502, 1802, 1902, the hard masks 604, the remaining second, fourth and fifth dielectric layer 506', 1202', 1304', and the remaining liner 802'. The second planarization results in the formation of central sidewall structures 140a, 140b, and the formation of central dielectrics 142a, 142b, within the central region 602. The central sidewall structures 140 are spaced in the central region 602 and are formed over and laterally abutting corresponding central dielectrics 142. The second planarization further results in top sealers 130a, 130b sealing corresponding top surfaces of the memory gates 124, side sealers 132a, 132b sealing corresponding lower sidewalls of the memory gates 124, and spacers 128a, 128b spacing lower, outer sidewalls and upper, inner sidewalls of corresponding memory gates 124. The second planarization can, for example, be performed using a CMP.

FIG. 1 illustrates a cross-sectional view 100 of some embodiments corresponding to Actions 336 and 338. As shown by FIG. 1, a ninth, interlayer dielectric is formed over the planar top surface of the semiconductor structure and conductive contacts 114a, 114b, 118 are formed extending vertically down through the remaining eighth dielectric layer 1902' and the ninth dielectric layer (collectively an interlayer dielectric 106) to the contact pads 116, 120.

Thus, as can be appreciated from above, the present disclosure provides IC comprising a semiconductor substrate, a select gate, a memory gate, a sidewall structure, and a dielectric layer. The semiconductor substrate comprises a first source/drain region and a second source/drain region. The select and memory gates are arranged over the semiconductor substrate. The select and memory gates are laterally spaced between the first and second source/drain regions with the memory gate arranged between the first source/drain region and the select gate. The sidewall structure is arranged over the semiconductor substrate between the select gate and the second source/drain region. The dielectric layer is arranged between neighboring sidewalls of the select gate and the sidewall structure, and is further arranged under the sidewall structure.

In other embodiments, the present disclosure provides a method of manufacturing a split gate flash memory cell. A select gate is formed on a semiconductor substrate. A sacrificial spacer is formed laterally adjacent to the select gate and on a first side of the select gate. A charge trapping layer is formed lining upper surfaces of the select gate and the sacrificial spacer, and further lining a sidewall surface of the select gate on a second side of the select gate that is opposite the first side of the select gate. A memory gate is formed over the charge trapping layer and on the second side of the select gate. The sacrificial spacer is removed.

In yet other embodiments, the present disclosure provides an IC. A select gate, a memory gate, and a sidewall structure are laterally spaced over a semiconductor substrate with the select gate between the memory gate and the sidewall structure. A dielectric layer is arranged between neighboring sidewalls of the select gate and the sidewall structure, and is further arranged under the sidewall structure. A charge trapping layer is arranged between neighboring sidewalls of the select gate and the memory gate, and is further arranged under the memory gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a split gate flash memory cell, said method comprising:
   forming a select gate on a semiconductor substrate;
   forming a sacrificial spacer laterally adjacent to the select gate and on a first side of the select gate;
   forming a charge trapping layer lining upper surfaces of the select gate and the sacrificial spacer, and further lining a sidewall surface of the select gate on a second side of the select gate that is opposite the first side of the select gate;
   forming a memory gate over the charge trapping layer and on the second side of the select gate; and
   removing the sacrificial spacer.

2. The method according to claim 1, wherein forming the sacrificial spacer comprises:
   forming a dielectric layer lining the select gate;
   forming a sacrificial layer covering the select gate and the dielectric layer;
   performing a planarization into the sacrificial layer to about even with a hard mask covering the select gate; and
   performing an etch into regions of the dielectric and sacrificial layers on the second side of the select gate to remove the regions.

3. The method according to claim 1, wherein forming the memory gate comprises:
   forming a memory gate layer over the charge trapping layer;
   forming a spacer layer over the memory gate layer; and
   performing an etch into the spacer and memory gate layers to form a spacer overlying a ledge of the memory gate.

4. The method according to claim 1, further comprising:
   performing an etch into the charge trapping dielectric layer before removing the sacrificial spacer, wherein the etch removes lateral stretches of the charge trapping dielectric layer that are uncovered.

5. The method according to claim 1, further comprising:
   forming a first sidewall structure laterally adjacent to the select gate, on the first side of the select gate, and spaced over the semiconductor substrate by a first distance; and
   forming a second sidewall structure laterally adjacent to the charge trapping layer, on the second side of the select gate, and spaced over the semiconductor substrate by a second distance less than the first distance.

6. The method according to claim 5, further comprising:
   forming the second sidewall structure abutting a sidewall surface of the charge trapping layer, and on an opposite side of the charge trapping layer as the select gate.

7. The method according to claim 1, further comprising:
   forming a dielectric layer lining the select gate and the semiconductor substrate;
   forming the sacrificial spacer over the dielectric layer; and
   removing regions of the dielectric layer on the second side of the select gate.

8. The method according to claim 7, further comprising:
   forming a sidewall structure over the dielectric layer, laterally adjacent to the select gate, after removing the sacrificial spacer.

9. An integrated circuit (IC) comprising:
   a select gate, a memory gate, and a sidewall structure laterally spaced over a semiconductor substrate with the select gate between the memory gate and the sidewall structure;
   a dielectric layer arranged between neighboring sidewalls of the select gate and the sidewall structure, and arranged under the sidewall structure; and
   a charge trapping layer arranged between neighboring sidewalls of the select gate and the memory gate, and arranged under the memory gate.

10. The IC according to claim 9, further comprising:
   an additional sidewall structure arranged over the semiconductor substrate laterally adjacent to the charge trapping dielectric layer, wherein a lower surface of the additional sidewall structure is recessed below a lower surface of the memory gate, and wherein a distance between a lower surface of the sidewall structure and the semiconductor substrate is greater than a distance between the lower surface of the additional sidewall structure and the semiconductor substrate.

11. The IC according to claim 9, wherein the sidewall structure is a dielectric material and is confined over the dielectric layer with an upper surface that is substantially coplanar with the select gate.

12. An integrated circuit (IC) comprising:
   a semiconductor substrate comprising a first source/drain region and a second source/drain region;
   a select gate and a memory gate arranged over the semiconductor substrate, wherein the select and memory gates are laterally spaced between the first and second source/drain regions with the memory gate arranged between the first source/drain region and the select gate;
   a sidewall structure arranged over the semiconductor substrate between the select gate and the second source/drain region; and
   a dielectric layer arranged between neighboring sidewalls of the select gate and the sidewall structure, and arranged under the sidewall structure.

13. The IC according to claim 12, wherein the sidewall structure is a dielectric material and is confined over the dielectric layer with an upper surface that is substantially coplanar with the select gate.

14. The IC according to claim 12, further comprising:
   a top sealer arranged on an upper surface of the memory gate; and
   a side sealer arranged along a sidewall surface of the memory gate, laterally between the sidewall surface and the first source/drain region.

15. The IC according to claim 14, further comprising:
   a spacer arranged on a ledge of the memory gate, laterally between the top sealer and the side sealer.

16. The IC according to claim 12, wherein upper surfaces of the select gate, the sidewall structure, and the dielectric layer are substantially coplanar.

17. The IC according to claim 16, wherein an upper surface of the memory gate is recessed below the upper surfaces of the select gate, the sidewall structure, and the dielectric layer.

18. The IC according to claim 12, further comprising:
   a charge trapping layer arranged between neighboring sidewalls of the select and memory gates, and arranged under the memory gate.

19. The IC according to claim 18, further comprising:
   an additional sidewall structure arranged over the semiconductor substrate laterally between the charge trapping layer and the first source/drain region.

20. The IC according to claim 19, wherein a distance between a lower surface of the sidewall structure and the semiconductor substrate is greater than a distance between a lower surface of the additional sidewall structure and the semiconductor substrate.

* * * * *